United States Patent
Lang et al.

(10) Patent No.: US 7,582,555 B1
(45) Date of Patent: Sep. 1, 2009

(54) CVD FLOWABLE GAP FILL

(75) Inventors: Chi-I Lang, Sunnyvale, CA (US); Judy H. Huang, Los Gatos, CA (US); Michael Barnes, San Ramon, CA (US); Sunil Shanker, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 142 days.

(21) Appl. No.: 11/323,812

(22) Filed: Dec. 29, 2005

(51) Int. Cl.
H01L 21/4763 (2006.01)

(52) U.S. Cl. .................. 438/623; 438/638; 438/758; 438/763; 438/780; 438/789; 257/E21.263; 257/E21.277; 257/E21.279; 257/E21.576; 257/E21.579

(58) Field of Classification Search .................. 438/623, 438/638, 753, 758, 763, 780, 788, 789, 795; 257/E21.263, 277, 279, 288, 304, 311, 576, 257/579
See application file for complete search history.

(56) References Cited

U.S. PATENT DOCUMENTS

| | | | |
|---|---|---|---|
| 4,740,480 A | 4/1988 | Ooka | |
| 5,320,983 A | 6/1994 | Quellet | |
| 5,516,721 A | 5/1996 | Galli et al. | |
| 5,858,880 A | 1/1999 | Dobson et al. | |
| 5,874,367 A | 2/1999 | Dobson | |
| 5,899,751 A | 5/1999 | Chang et al. | |
| 5,902,127 A | 5/1999 | Park | |
| 5,932,289 A | 8/1999 | Dobson et al. | |
| 6,054,379 A * | 4/2000 | Yau et al. | 438/623 |
| 6,072,227 A * | 6/2000 | Yau et al. | 257/642 |
| 6,143,626 A | 11/2000 | Yabu et al. | |
| 6,218,268 B1 | 4/2001 | Xia et al. | |
| 6,242,366 B1 | 6/2001 | Beekman et al. | |
| 6,287,989 B1 | 9/2001 | Dobson | |
| 6,300,219 B1 | 10/2001 | Doan et al. | |
| 6,383,951 B1 * | 5/2002 | Li | 438/781 |
| 6,413,583 B1 * | 7/2002 | Moghadam et al. | 427/249.15 |
| 6,448,187 B2 * | 9/2002 | Yau et al. | 438/758 |
| 6,475,564 B1 | 11/2002 | Carter et al. | |
| 6,544,858 B1 | 4/2003 | Beekman et al. | |
| 6,640,840 B1 | 11/2003 | MacNeil | |

(Continued)

OTHER PUBLICATIONS

U.S. Office Action mailed Aug. 23, 2005, from U.S. Appl. No. 10/810,066.

(Continued)

*Primary Examiner*—Michael S Lebentritt
(74) *Attorney, Agent, or Firm*—Weaver Austin Villeneuve & Sampson LLP

(57) ABSTRACT

The present invention meets these needs by providing improved methods of filling gaps. In certain embodiments, the methods involve placing a substrate into a reaction chamber and introducing a vapor phase silicon-containing compound and oxidant into the chamber. Reactor conditions are controlled so that the silicon-containing compound and the oxidant are made to react and condense onto the substrate. The chemical reaction causes the formation of a flowable film, in some instances containing Si—OH, Si—H and Si—O bonds. The flowable film fills gaps on the substrates. The flowable film is then converted into a silicon oxide film, for example by plasma or thermal annealing. The methods of this invention may be used to fill high aspect ratio gaps, including gaps having aspect ratios ranging from 3:1 to 10:1.

20 Claims, 8 Drawing Sheets

U.S. PATENT DOCUMENTS

| | | | |
|---|---|---|---|
| 6,653,247 | B2 | 11/2003 | MacNeil |
| 6,660,663 | B1 * | 12/2003 | Cheung et al. .............. 438/789 |
| 6,790,737 | B2 | 9/2004 | Schneegans et al. |
| 6,828,162 | B1 | 12/2004 | Halliyal et al. |
| 6,846,757 | B2 | 1/2005 | MacNeil |
| 6,858,195 | B2 * | 2/2005 | Aronowitz et al. .......... 423/337 |
| 6,984,561 | B2 * | 1/2006 | Herner et al. ............... 438/257 |
| 7,074,690 | B1 | 7/2006 | Gauri et al. |
| 7,074,727 | B2 * | 7/2006 | Hsu et al. ................... 438/788 |
| 7,498,273 | B2 * | 3/2009 | Mallick et al. ......... 257/E21.17 |
| 2002/0006729 | A1 | 1/2002 | Geiger et al. |
| 2004/0048455 | A1 * | 3/2004 | Karasawa et al. ........... 438/502 |
| 2004/0152342 | A1 | 8/2004 | Li et al. |
| 2007/0281495 | A1 | 12/2007 | Mallick et al. |

OTHER PUBLICATIONS

Gauri et al., "Selective Gap-Fill Process", Novellus Systems, Inc., U.S. Appl. No. 10/810,066, filed Mar. 25, 2004, 27 pages.

Notice of Allowance and Fee Due mailed Feb. 15, 2006 from U.S. Appl. No. 10/810,066.

Allowed Claims from U.S. Appl. No. 10/810,066.

Gauri et al., "Flowable Film Dielectric Gap Fill Process," Novellus Systems, Inc., U.S. Appl. No. 11/447,594, filed Jun. 5, 2006.

U.S. Office Action mailed Jun. 27, 2008, from U.S. Appl. No. 11/447,594.

Wang, et al., "CVD Flowable Gap Fill," Novellus Systems, Inc., U.S. Appl. No. 11/925,514, filed Oct. 26, 2007.

Wang, et al., "Density Gradient-Free Gap Fill," Novellus Systems, Inc., U.S. Appl. No. 11/834,581, filed Aug. 6, 2007.

Notice of Allowance and Fee Due mailed Feb. 15, 2006 from U.S. Appl. No. 11/447,594.

Allowed Claims from U.S. Appl. No. 11/447,594, filed Jun. 5, 2006.

U.S. Office Action mailed Nov. 4, 2008, from U.S. Appl. No. 11/925,514.

U.S. Office Action mailed Nov. 12, 2008, from U.S. Appl. No. 11/834,581.

Antonelli et al., "PECVD Flowable Dielectric Gap Fill," Novellus Systems, Inc., U.S. Appl. No. 12/334,726, filed Dec. 15, 2008.

* cited by examiner

CVD FLOWABLE GAP FILL

BACKGROUND OF THE INVENTION

This invention relates to electronic device fabrication processes. More specifically, the invention relates to chemical vapor deposition processes for forming dielectric layers in high aspect ratio, narrow width recessed features.

It is often necessary in semiconductor processing to fill a high aspect ratio gaps with insulating material. This is the case for shallow trench isolation, inter-metal dielectric layers, passivation layers, etc. As device geometries shrink and thermal budgets are reduced, void-free filling of high aspect ratio spaces (e.g., AR>3:1) becomes increasingly difficult due to limitations of existing deposition processes.

Most deposition methods deposit more material on the upper region than on the lower region of a sidewall and/or form top-hats at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. One such problematic reentrant feature is a narrowing at the top of the gap. The etched sidewalls slope inward near the top of the gap. For a given aspect ratio feature, this increases the ratio of gap volume to gap access area seen by the precursor species during deposition. Voids and seams formation is more likely under these conditions. If the top of the gap prematurely closes off, a chemical etch is required to re-open the gap before more film can be deposited in the gap.

One approach to gap fill is high-density plasma chemical vapor deposition (HDP CVD). HDP CVD is a directional (bottom-up) CVD process that is used for high aspect ratio gap-fill. The method deposits more material at the bottom of a high aspect ratio structure than on its sidewalls. It accomplishes this by directing charged dielectric precursor species downward, to the bottom of the gap. Nevertheless, some overhang or top-hat formation still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases.

HDP CVD processes rely on plasma etch steps to remove sidewall deposits and top-hats. Typically a fluorine species, such as $NF_3$, is used between dielectric film deposition steps to etch the film. After a layer of dielectric partially fills gaps on a substrate, the fluorine-containing plasma etches the layer to remove top-hats and open the gap for further deposition. However, these etch steps may be inappropriate in some applications.

Alternative dielectric deposition processes that can fill high aspect ratio features of narrow width, reduce sidewall and top-hat formation and eliminate the need for etch steps during dielectric deposition would be desirable.

SUMMARY OF THE INVENTION

The present invention meets these needs by providing new methods of filling gaps. In certain embodiments, the methods involve placing a substrate into a reaction chamber and introducing a vapor phase silicon-containing compound and oxidant into the chamber. Reactor conditions are controlled so that the silicon-containing compound and the oxidant are made to react and condense onto the substrate. The chemical reaction causes the formation of a flowable film, in some instances containing Si—OH, Si—H and Si—O bonds. The flowable film fills gaps on the substrates. The flowable film is then converted into a final silicon oxide film, for example by plasma or thermal annealing. The methods of this invention may be used to fill high aspect ratio gaps, including gaps having aspect ratios ranging from 3:1 to 10:1.

One aspect of the invention relates to a method of depositing a dielectric film on a substrate, the method involving the steps of a) placing the substrate in a reaction chamber; b) introducing a process gas comprising a silicon-containing compound and an oxidant; and c) exposing the substrate to the process gas under conditions such that the silicon-containing compound and the oxidant react to form a flowable film on the substrate surface. In certain embodiments, the method further involves converting the flowable film into a solid dielectric material (e.g., a silicon oxide film). In certain embodiments, conversion of the film may be accomplished by annealing the as-deposited film by a thermal or plasma anneal.

Another aspect of the invention relates to a method of filling gaps on a substrate with dielectric material. The method involves the steps of a) placing the substrate in a reaction chamber; b) introducing a process gas comprising a silicon-containing compound and an oxidant; c) exposing the substrate to the process gas under conditions such that the silicon-containing compound and the oxidant react to form a flowable film in the gap; and d) converting the flowable film to a dielectric material.

Another aspect of the invention relates to a method of filling gaps on a substrate with dielectric material that involves the operations of a) placing the substrate in a reaction chamber; b) introducing a process gas comprising a silicon-containing compound into the reaction chamber; c) exposing the substrate to the process gas under conditions such that a silicon-containing film is deposited in the gaps via a plasma-assisted reaction; d) introducing an oxidant into the reaction chamber; e) exposing the silicon-containing film to the oxidant such that a flowable film comprising Si—H, Si—O and Si—OH bonds is formed in the gaps; and e) converting the as-deposited film to a dielectric material.

DETAILED DESCRIPTION OF THE INVENTION

Introduction

The present invention relates to deposition processes that provide complete gap of fill high aspect ratio (typically at least 3:1), narrow width gaps.

Most deposition methods either deposit more material on the upper region than on the lower region of a sidewall or form cusps (also called top-hats) at the entry of the gap. To remove sidewall and top-hat deposits and keep the gap open for further deposition, conventional HDP CVD processes typically use a multi-cycle deposition process—etch process. Each cycle includes a deposition step followed by an etch step Typically, fluorine species are used in the etch step. These fluorine etch steps are costly and time-consuming, in some cases requiring multiple reactors.

Figure 1:
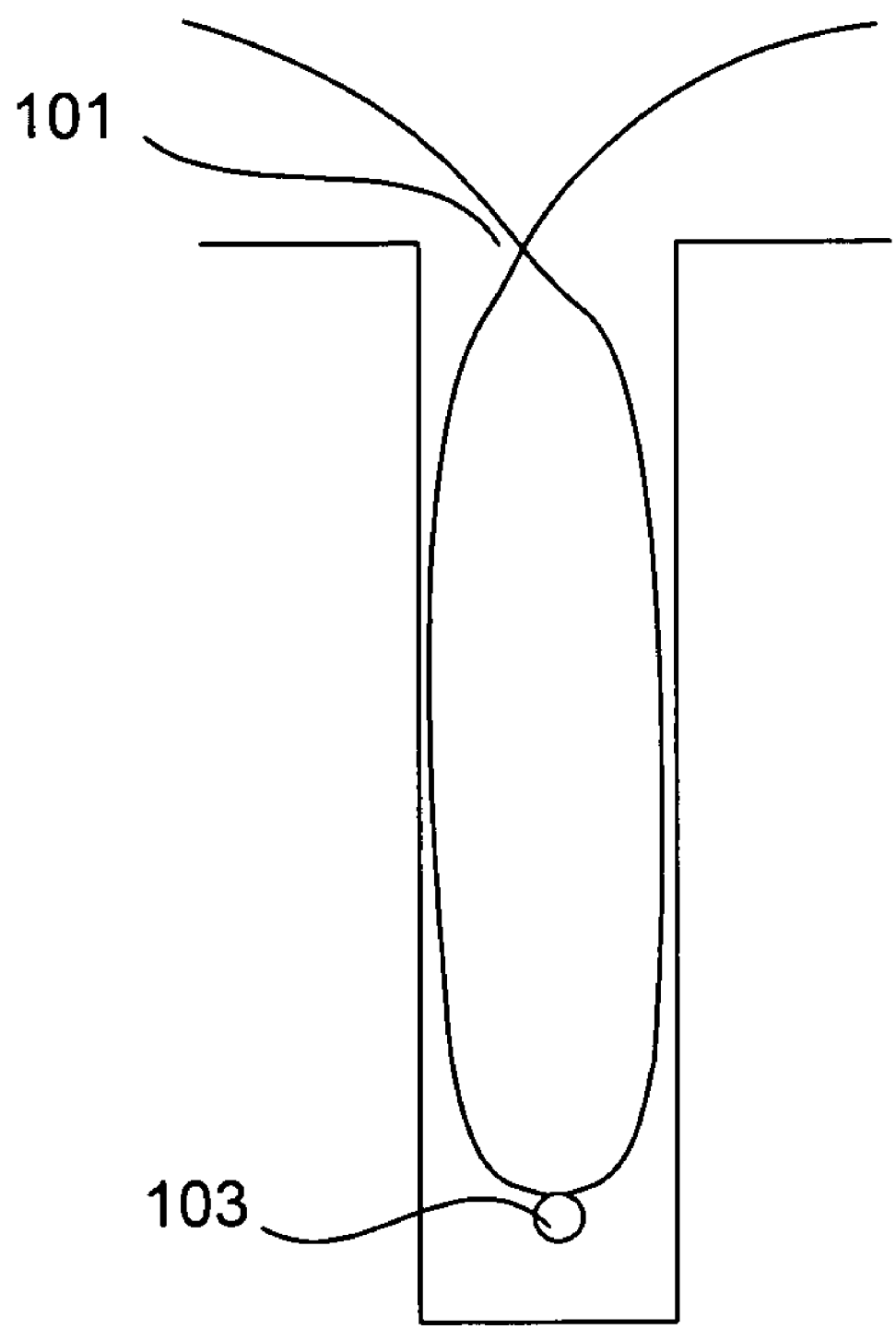
FIG. 1 is a rough schematic cross-sectional diagram of a trench partially filled by a conventional method.

FIG. 1 shows a rough schematic of a trench partially filled by a conventional HDP CVD method. Reference number 101 indicates where sidewalls have formed from film that has been sputtered away from the bottom of the trench and redeposited on the sidewalls of the trench. These sidewalls have pinched off preventing further deposition. A chemical etch is required to re-open the trench before dielectric film can be deposited in it. Multiple deposition-etch-deposition cycles are necessary to fill high aspect ratio trenches or other features. Reference number 103 indicates a weak spot. Conventional gap fill methods often lead to the formation of weak spots in the dielectric film. Weak spots may form as a result of the increased gap volume to gap access area as the gap closes off, and can lead to voids or seams in the gap and ultimately device failure.

Other known methods of gap-fill also rely on multi-cycle deposition methods and are susceptible to pinch-off at the top of the gap, and void and seam formation in the gap.

The present invention provides single-cycle gap-fill methods that result in good, seamless and void-free gap fill. The methods involve depositing a soft jelly-like liquid or flowable film and then converting the flowable film into a solid silicon oxide film. The methods of the present invention eliminate the need for etch steps.

Process

Figure 2:
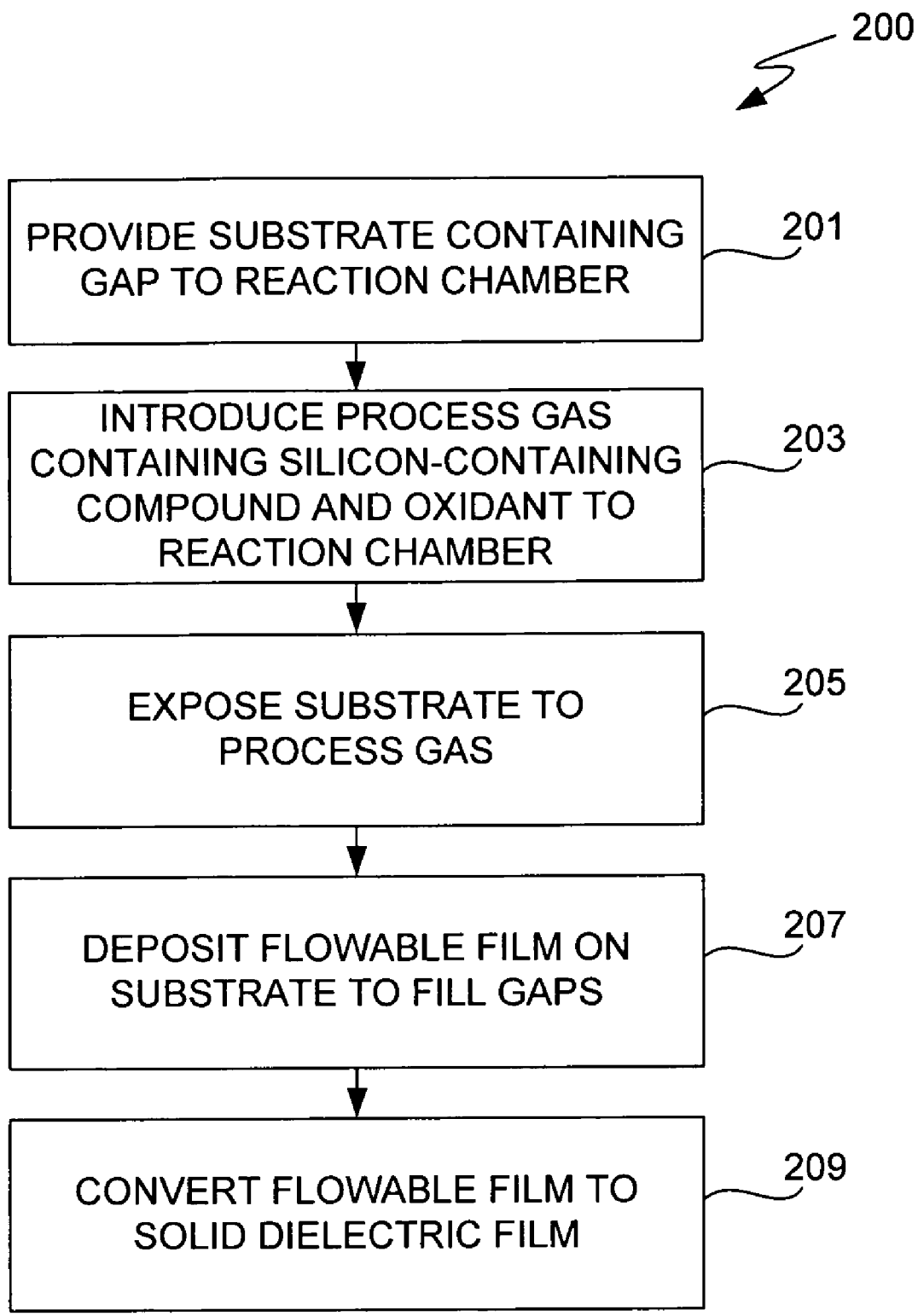
FIG. 2 is a process flow diagram depicting a method according to one embodiment of the invention.

FIG. 2 is a process flow sheet depicting a method according to one embodiment of the present invention. As shown, a deposition process 200 begins at operation 201 in which a substrate containing a gap is provided to a reaction chamber. Providing the substrate to the reactor may involve clamping the substrate to a pedestal or other support in the chamber. For this purpose, an electrostatic or mechanical chuck may be employed.

After the substrate is provided to the reaction chamber, a process gas is introduced at operation 203. The process gas includes a silicon-containing compound and an oxidant. The gas may also include one or more dopant precursors. Sometimes, though not necessarily, an inert carrier gas is present. In certain embodiments, the gases are introduced using a liquid injection system. Typically the silicon-containing compound and the oxidant are introduced via separate inlets. In certain embodiments the oxidant is doped with a compound that contributes to reducing the reaction rate at the wafer surface. Examples of dopant compounds that reduce the reaction rate include alcohols, e.g., ethanol and isopropyl alcohol. Reducing the reaction rate at the wafer surface may be desirable to facilitate continuous film propagation and growth. Also, in certain embodiments, the reactants may be provided in manner that increases residence time over the wafer surface. For example, in some embodiments, an inert gas (e.g., He, Ar or $N_2$) ballast is provided to increase reactant utilization. The ballast is provided below a baffle plate assembly. This constricts the flow of reactants thereby increasing their resident time over the wafer substrate.

The substrate is then exposed to the process gas at operation 205. Conditions in the reactor are such that the silicon-containing compound and the oxidant react and condense. As shown in operation 207, a flowable film is thereby deposited on the substrate surface. The substrate is exposed to the process gas for a period sufficient to deposit a flowable film to fill the gap. The deposition process typically forms soft jelly-like film with good flow characteristics, providing consistent fill. The deposited film may also be described herein for the purposes of discussion as a gel having liquid flow characteristics, a liquid film or a flowable film.

Process conditions in the reactor are such that the reaction product condenses on the surface. In many embodiments, this involves bringing the substrate into the chamber under "dark", i.e., non-plasma conditions. The substrate is not exposed to a plasma during the deposition phase (steps 205 and 207) of the process. Although not indicated on the flow sheet, gaseous byproducts may be continuously pumped from the reaction chamber.

After the flowable film has been deposited in the gap, the as-deposited flowable film is converted to a silicon oxide dielectric film in operation 209. In some embodiments, the film is converted by exposure to a plasma containing, for example, one or more of oxygen, helium, argon and water.

Process Parameters

Process Gas

The process gas contains a silicon-containing compound and an oxidant. Suitable silicon-containing compounds include organo-silanes and organo-siloxanes. In certain embodiments, the silicon-containing compound is a commonly available liquid phase silicon source. In some embodiments, a silicon-containing compound having one or more mono, di, or tri-ethoxy, methoxy or butoxy functional groups is used. Examples include, but are not limited to, TOMCAT, OMCAT, TEOS, tri-ethoxy silane (TES), TMS, MTEOS, TMOS, MTMOS, DMDMOS Diethoxy silane (DES), triphenylethoxysilane, 1-(triethoxysilyl)-2-(diethoxymethylsilyl) ethane, tri-t-butoxylsilanol and tetramethoxy silane. Examples of suitable oxidants include ozone, hydrogen peroxide and water.

In some embodiments, the silicon-containing compound and the oxidant are delivered to the reaction chamber via liquid injection system that vaporizes the liquid for introduction to the chamber. The reactants are typically delivered separately to the chamber. Typical flow rates of the liquid introduced into a liquid injection system range from 0.1-5.0 mL/min per reactant. Of course, one of skill in the art will understand that optimal flow rates depend on the particular reactants, desired deposition rate, reaction rate and other process conditions.

Acceptable silicon-containing compound/oxidant flow ratios are very variable, as there is typically only a single reaction. Examples of suitable ratios include 3:1-1:100.

The flowable film deposited on the substrate typically contains some combination of Si—O, Si—H and Si—OH bonds. As discussed above, in many embodiments, the reaction of the silicon-containing compound and the oxidant takes place in non-plasma conditions. The absence of RF power (or other plasma source) prevents the incorporation of organic groups in the film. For example, in reaction between TES and steam, the chemical reaction causes formation of a flowable film containing Si—OH, Si—H and Si—O bonds, while the ethoxy group is removed as a gaseous ethanol byproduct. As discussed above with respect to FIG. 1, the byproduct is continuously pumped out.

As indicated above, in certain embodiments a chemical reagent that acts as an inhibitor to slow down the reaction between the silicon and oxidant precursors is used. Examples of such reagents include alcohols such as ethanol, isopropyl alcohol, etc. Ethanol is a by-product of the original chemical reaction as shown in the equation below between the silicon-containing precursor H—Si—(O—C₂H₅)₃ and the oxidant H₂O:

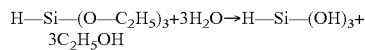

While not being bound by any particular theory, it is believed that the providing ethanol along with the oxidant precursor causes the reaction to be slowed down due to only two of the ethoxy groups on the silicon-containing precursor being converted. It is believed that the remaining ethoxy groups serves to network the film by acting as a link. Depicted below is one embodiment of this method using a 25-90% molar solution of ethanol:

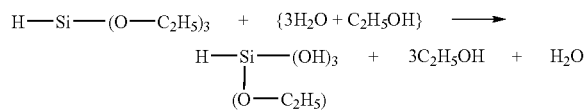

Film composition depends in part on the oxidant chosen, with a weaker oxidant (e.g., water) resulting in more Si—H bonds than a stronger oxidant (e.g., ozone). Using ozone will result in conversion of most of the Si—H bonds to Si—OH bonds. An exemplary reaction according to one embodiment of the invention between an organo-silane precursor ($R_{4-x}$—$SiH_x$) and peroxide ($H_2O_2$) produces a silanol gel (R—Si(OH)$_x$ as well as other byproducts that may be pumped out.

Deposition Reaction Conditions

Reactions conditions are such that the silicon-containing compound and oxidant, undergo a condensation reaction, condensing on the substrate surface to form a flowable film.

As discussed above, the reaction typically takes place in dark or non-plasma conditions. Chamber pressure may be between about 1-100 Torr, in certain embodiments, it is between 5 and 20 Torr, or 10 and 20 Torr. In a particular embodiment, chamber pressure is about 10 Torr.

Substrate temperature is typically between about −20 and 100 C. In certain embodiments, temperature is between about 0 and 35 C. Pressure and temperature may be varied to adjust deposition time; high pressure and low temperature are generally favorable for quick deposition. High temperature and low pressure will result in slower deposition time. Thus, increasing temperature may require increased pressure. In one embodiment, the temperature is about 5 C and the pressure about 10 Torr.

Exposure time depends on reaction conditions as well as the desired film thickness. Deposition rates are typically from about 100 angstroms/min to 1 micrometer/min.

Showerhead (or other gas inlet) to pedestal distance should also be small to facilitate deposition. Showerhead-pedestal distance is typically ranges from about 300 mil-5 inches. In some embodiments, it ranges from about 300 mil-1 inch.

Figure 6:
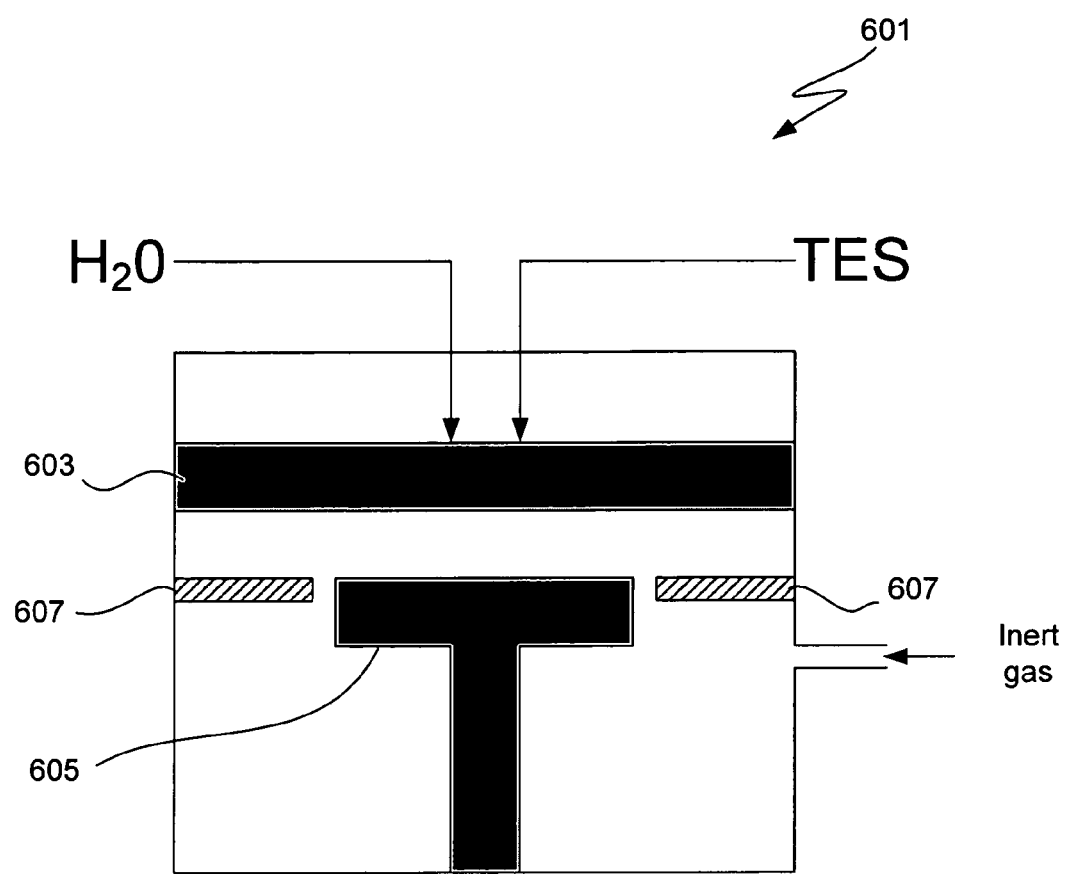
FIG. 6 shows an embodiment of the reaction chamber utilizing a baffle plate assembly to increase precursor utilization.

A baffle plate assembly is utilized in certain embodiments to constrict reactant flow, thereby increasing the residence time of the silicon and oxidant precursors above the wafer substrate. The baffle plate assembly is mechanically attached to the chamber body and tends to be at the same temperature of the chamber walls (i.e >30 C) to prevent deposition from occurring on the baffle plates. The change in conductance is achieved by providing an inert gas ballast below the baffle plates. Examples of inert gases that may be used include He, Ar and N₂. Typical flow rates for the ballast vary from 100 sccm to 5 slm for the inert gases. In one embodiment a flow of 2 slm of He is used to create a ballast. A schematic of a deposition using baffle is depicted in FIG. 6 and discussed further below.

Converting the Flowable Film to a Solid Oxide Film

After the flowable film is deposited on the substrate, it is converted to a solid silicon dioxide film. According to various embodiments, the film may be converted to a solid oxide film by exposure to a plasma. This results in a top-down conversion of the flowable film to a solid film.

Oxygen, helium, argon and steam plasmas are examples of plasmas that may be used. The plasma may also contain one or more of these compounds. Nitrogen-containing plasmas should be avoided if the incorporation of nitrogen in the resulting dielectric film is undesirable. Temperatures during plasma exposure are typically about 200 C or higher.

In certain embodiments, an oxygen or oxygen-containing plasma is used to facilitate conversion of the Si—H bonds into Si—O bonds. An oxygen-containing plasma may be particularly useful for flowable films that have a high number of Si—H bonds, e.g., for films formed by the reaction of TEOS and steam.

Pressure is typically low, e.g., less than about 6 Torr. In certain embodiments, ultra-low pressures, on the order of about 0-10 mTorr are used during the conversion step. Using low pressure allows top-down conversion of the flowable film without leaving voids in the film. Without being bound by a particular theory, it is believed that low pressure causes sites left vacant by the removal of —H and —OH groups to be filled only by available oxygen radicals in the plasma. Also in certain embodiments, inductively coupled (high density) plasmas are used to facilitate conversion.

The plasma source may be any known plasma source, including RF and microwave sources. In a RF plasma, plasma power is typically at least about 3000 W. Also the plasma-assisted conversion is preferably performed with a high frequency substrate bias.

In some embodiments, a thermal anneal may be used instead of or in addition to a plasma to convert the film into a solid oxide. Thermal annealing may be performed in any suitable ambient, such as a water, oxygen or nitrogen ambient. Temperatures are typically at least about 250 C, i.e. high enough to break the Si—OH bond. For example, thermally annealing a silanol gel R—Si(OH)$_x$ results in a silicon dioxide SiO₂ film and water vapor.

Other Embodiments

Figure 3:
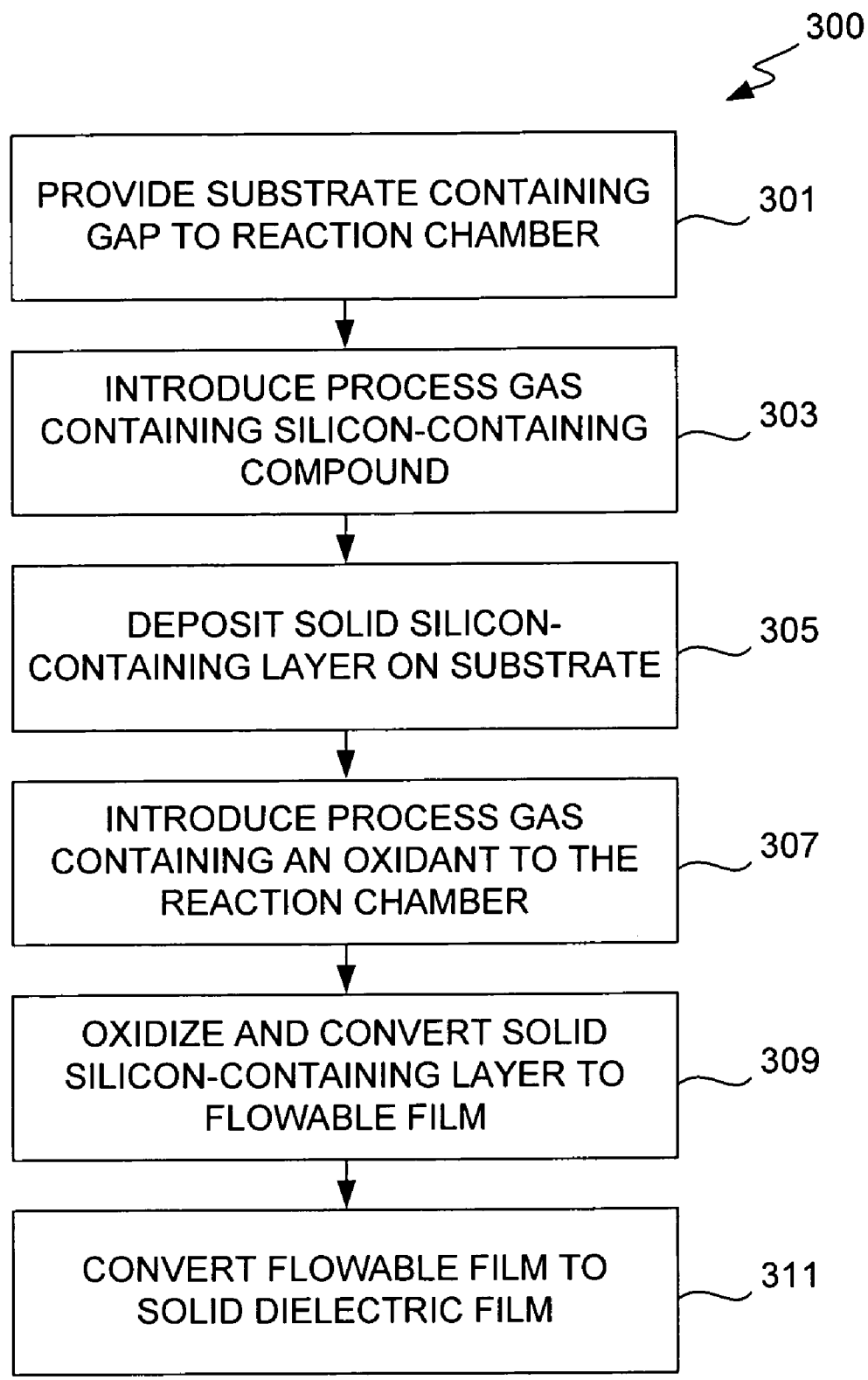
FIG. 3 is a process flow diagram depicting a method according to one embodiment of the invention.

In another embodiment, the flowable film is formed by first depositing the silicon-containing precursor and then flowing steam to convert the film to the flowable liquid. An example of a process according to this embodiment is shown in FIG. 3. As shown, the deposition process 300 begins at operation 301 in which a substrate containing a gap is provided to a reaction chamber. At operation 303, a process gas containing a silicon-containing precursor is introduced to the reactor. In this method, the process gas introduced in operation 303 does not contain an oxidant. Examples of silicon-containing precursors include TES and TEOS. A diluent gas such as helium or other suitable diluent may be used. Then in operation 305, a solid silicon-containing layer is deposited on the substrate. Low RF power (less than about 400 W) is typically used to deposit the film. Substrate temperature is also typically fairly low during this step, for example, less than about 100 C. In some embodiments, the temperature may be less than about 20 C. In a particular embodiment, the substrate temperature is subzero.

After the silicon-containing layer is deposited, a process gas containing an oxidant is introduced to the reaction chamber in operation 307. In specific example, the oxidant is $H_2O$ (steam). The process gas may be introduced with or without RF power. Substrate temperature is typically the same as for operation 305. The water or other oxidant oxidizes the solid film and converts it to a flowable film such as that described above with respect to operation 207 of FIG. 2 in operation 309. The oxidizer in one embodiment is water with a flow rate varying from 0.1 to 5 ml/min flow rate. One of skill in the art will understand that optimal flow rates depend on the degree of oxidation achieved and film conversion based on the kind of silicon precursor utilized The flowable film is then converted to a solid silicon oxide film in operation 311. A plasma or thermal anneal, as discussed above, may be used in operation 311.

Apparatus

The methods of the present invention may be performed on a wide-range of reaction chambers. The methods may be implemented on any chamber equipped for deposition of dielectric film, including HDP-CVD reactors, PECVD reactors, any chamber equipped for CVD reactions, and chambers used for PDL (pulsed deposition layers).

Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate.

In certain embodiments, the present invention may be implemented in a HDP CVD reactor. An example of a suitable reactor is the Speed™ reactor, available from Novellus Systems of San Jose, Calif. In certain embodiments, the present invention may be implemented in a PECVD reactor. Examples of suitable reactors are the Sequel™ reactor and the Vector™ reactor, both available from Novellus Systems of San Jose, Calif. In certain embodiments, the present invention may be implemented in a CVD chamber equipped for metal and/or dielectric deposition. An example of a suitable reactor is the Altus™ reactor available from Novellus Systems of San Jose, Calif. In certain embodiments, the present invention may be implemented in a chamber equipped for atomic layer deposition (ALD), pulsed deposition layer (PDL), or pulsed nucleation layer (PNL) reactions. An example of such a reactor is the Altus™ with PNL reactor available from Novellus Systems of San Jose, Calif.

In certain embodiments, the deposition and conversion operations are performed in the same reaction chamber. In other embodiments, the deposition may be performed in a first chamber and then transferred to a second chamber for a thermal or plasma anneal. For example, reactors that are configured for plasma reactions may be used for both the deposition and plasma anneal operations. Other reactors may be used for deposition and thermal anneal operations.

Figure 4:
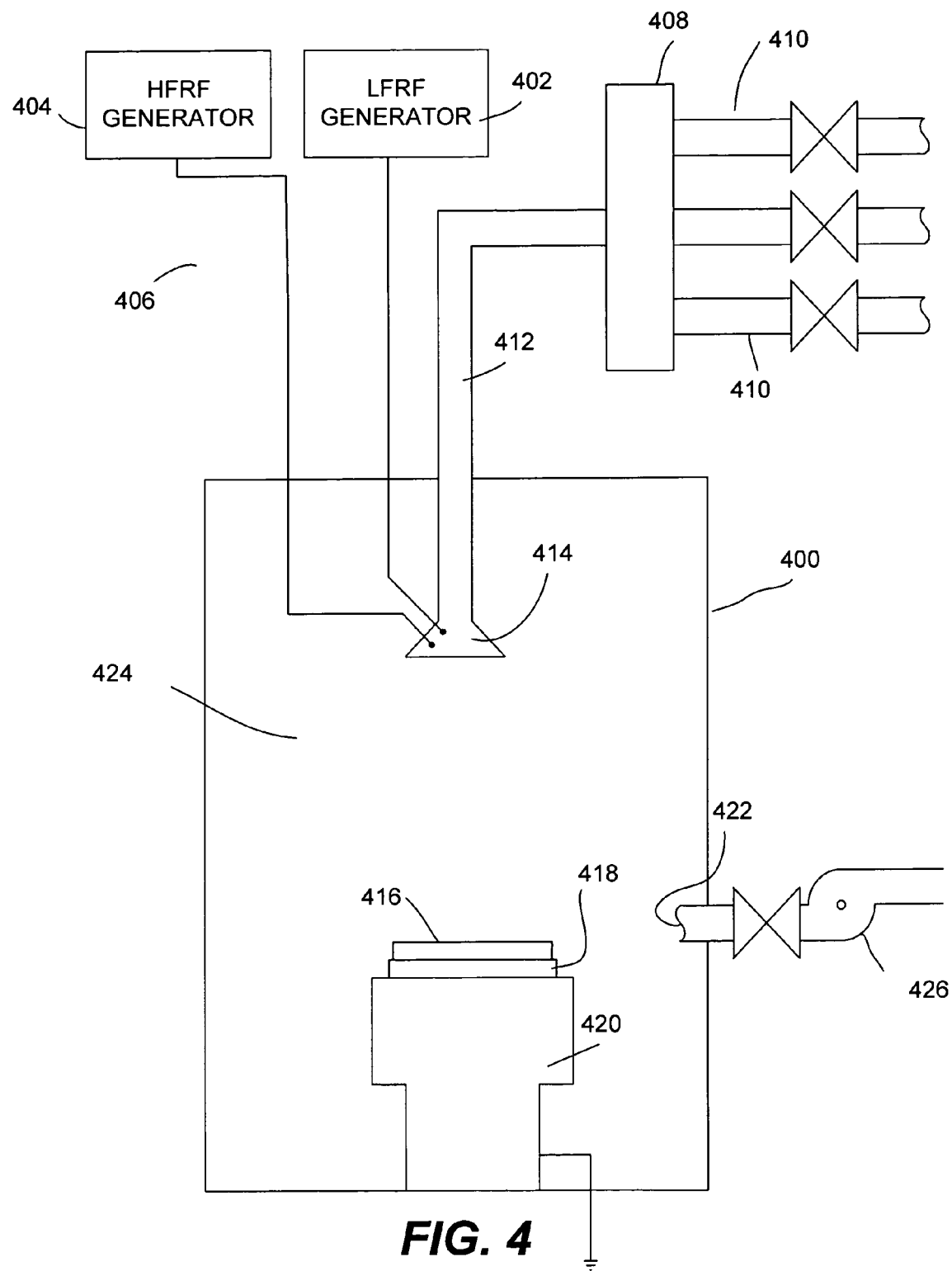
FIGS. 4 and 5 are block diagram depicting some components of various reactors suitable for performing certain embodiments of the invention.

FIG. 4 shows an example of a reactor that may be used in accordance with certain embodiments of the invention. The reactor shown in FIG. 4 is suitable for both the dark deposition and conversion to a solid film, for example, by plasma anneal. As shown, a reactor 400 includes a process chamber 424, which encloses other components of the reactor and serves to contain the plasma generated by a capacitor type system including a showerhead 414 working in conjunction with a grounded heater block 420. A low-frequency RF generator 402 and a high-frequency RF generator 404 are connected to showerhead 414. The power and frequency are sufficient to generate a plasma from the process gas, for example 400-700 W total energy. In the implementation of the present invention, the generators are not used during dark deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 418 supports a substrate 416. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 412. Multiple source gas lines 410 are connected to manifold 408. The gases may be premixed or not. The temperature of the mixing bowl/manifold lines should be maintained at levels above the reaction temperature. Temperatures at or above about 80 C at pressures at or less than about 20 Torr usually suffice. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 400 via an outlet 422. A vacuum pump 426 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

It should be noted that the apparatus depicted in FIG. 4 is but one example of an apparatus that may be used to implement this invention.

Figure 5:
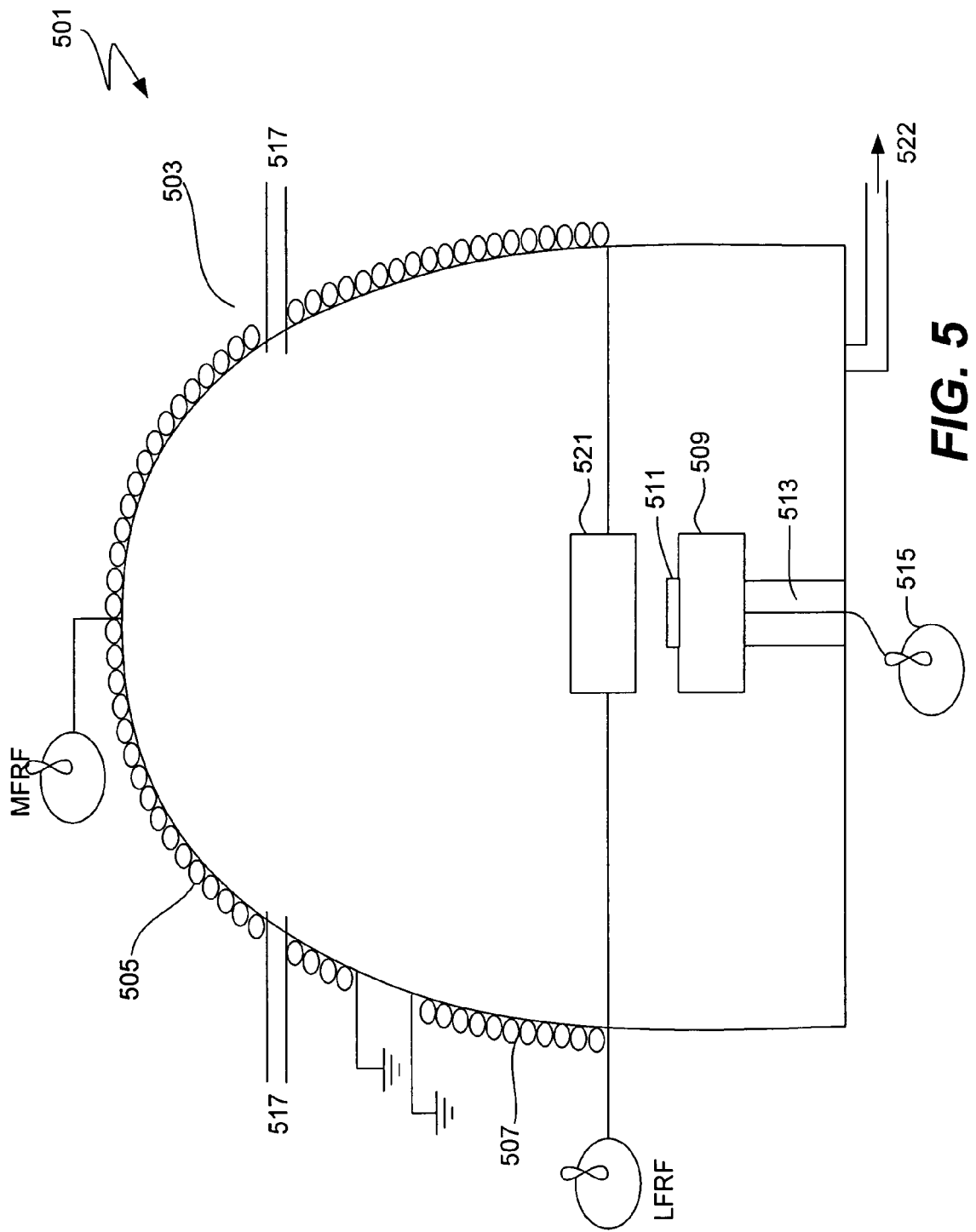

FIG. 5 provides a simple block diagram depicting various reactor components arranged as may be arranged in a HDP-CVD reactor that may be used in accordance with the invention. As shown, a reactor 501 includes a process chamber 503 which encloses other components of the reactor and serves to contain the plasma. In one example, the process chamber walls are made from aluminum, aluminum oxide, and/or other suitable material. The embodiment shown in FIG. 5 has two plasma sources: top RF coil 505 and side RF coil 507. Top RF coil 505 is a medium frequency or MFRF coil and side RF coil 507 is a low frequency or LFRF coil. In the embodiment shown in FIG. 5, MFRF frequency may be from 430-470 kHz and LFRF frequency from 340-370 kHz. However, the invention is not limited to operation in reaction chambers with dual sources, nor RF plasma sources. Any suitable plasma source or sources may be used.

Within the reactor, a wafer pedestal 509 supports a substrate 511. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 513 for supplying heat transfer fluid controls the temperature of substrate 511. The wafer chuck and heat transfer fluid system can facilitate maintaining the appropriate wafer temperatures.

A high frequency RF of HFRF source 515 serves to electrically bias substrate 511 and draw charged precursor species onto the substrate for the deposition reaction. Electrical energy from source 515 is coupled to substrate 511 via an electrode or capacitive coupling, for example. Note that the bias applied to the substrate need not be an RF bias. Other frequencies and DC bias may be used as well.

The process gases are introduced via one or more inlets 517. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 521, which may or may not direct the gases toward the substrate surface. Injectors may be connected to the primary gas ring 521 to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 503 via an outlet 522. A vacuum pump (e.g., a turbomolecular pump) typically draws process gases out and maintains a suitably low pressure within the reactor.

In certain embodiments, high-cost features of the Speed™ or other HDP-CVD tool may be eliminated. For example, the present invention may be implemented on a HDP-CVD reactor without a dome and/or turbo-molecular pumps.

As indicated above, in certain embodiments, a CVD reactor may include a baffle assembly. FIG. 6 shows an embodiment of a CVD reactor that includes a baffle plate assembly. As shown in FIG. 6, oxidant and silicon-containing precursor (as well as any dopant, carrier or other process gases) enter the reactor 601 through showerhead 603 above pedestal 605, which supports the wafer. In the example depicted in FIG. 6, $H_2O$ and TES are the oxidant and silicon-containing precursor, respectively. The inert gas enters the chamber below baffle plate 607. In certain embodiments, the baffle plate is physically connected to chamber body at the gas ring. A chamber manometer may also be located below the baffles. Use of the baffle plate and inert gas ballast increases reactant residence time.

Experimental

The following examples provide details illustrating aspects of the present invention. These examples are provided to exemplify and more clearly illustrate these aspects of the invention and are in no way intended to be limiting.

A flowable film was deposited in gaps on a substrate under dark conditions as described above with reference to FIG. 2. Substrate temperature was around room temperature for the deposition. The precursors used were TES (tri-ethoxy silane) and steam.

After deposition, the film was exposed to an oxygen plasma for 270 seconds. Oxygen flow rate was 500 sccm and RF power was 9000 W. The wafer substrate temperature during the plasma treatment was ~500 C.

Figure 7:
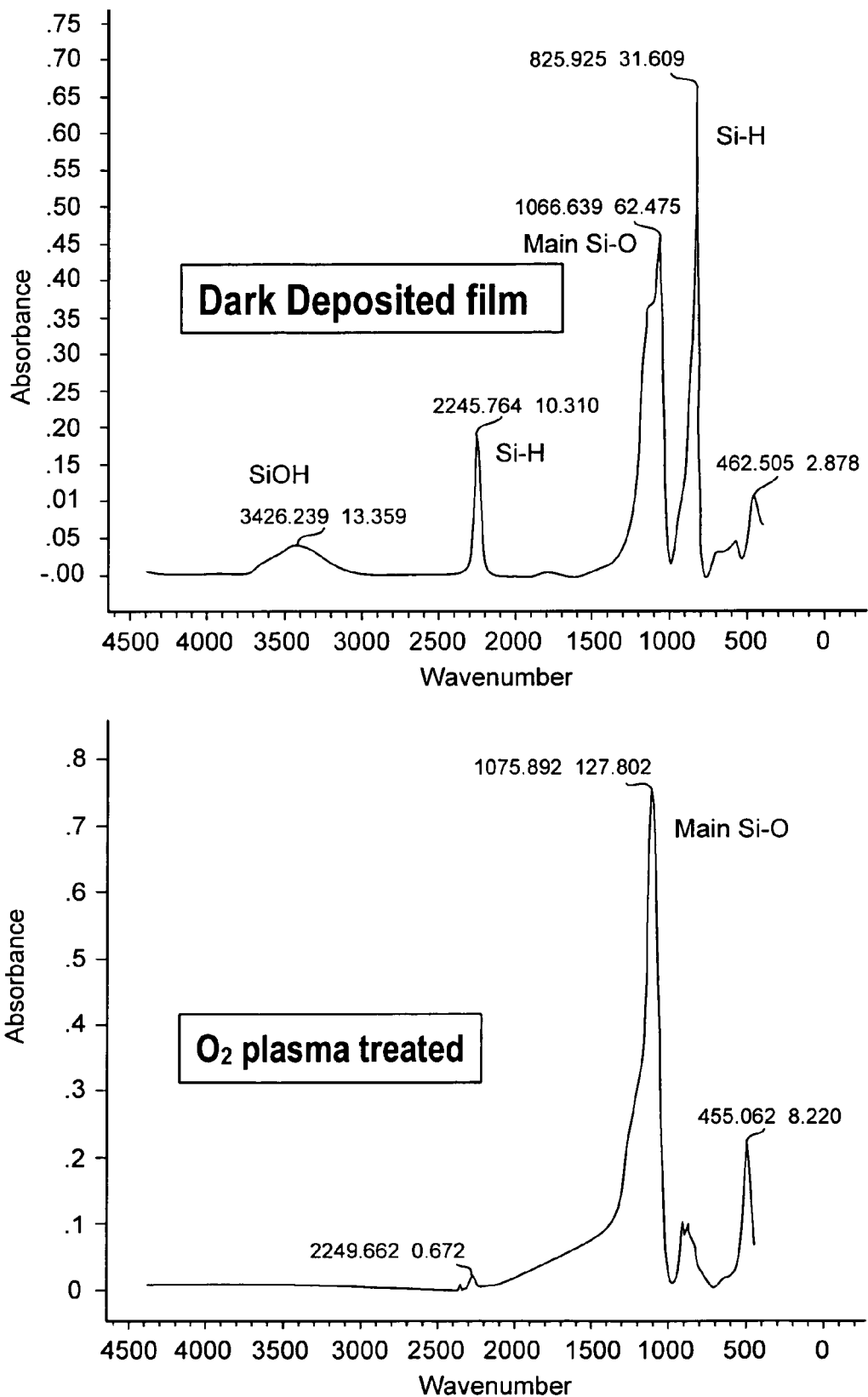
FIG. 7 shows FTIR spectra of a dark-deposited film before and after exposure to an oxygen plasma.

FIG. 7 shows FTIR spectra of the dark deposited flowable film and the plasma treated film. As can be seen from FIG. 6, Si—H, Si—OH and Si—O bonds are present in the dark deposited film. Treatment with an oxygen plasma results in removal of the —OH group, near elimination of the Si—H bonds and a considerable increase in the main Si—O bond.

A similarly deposited film was exposed to helium plasma for 60 seconds. The helium plasma treatment was observed to remove the Si—OH bonds. No changes were observed in the Si—H bonds. A similarly deposited film was exposed to a steam plasma for 180 seconds. The steam plasma treatment was observed to remove the Si—OH bonds and cause a slight decrease in Si—H bonds. A slight increase in Si—O bonds was also observed.

Figure 8:
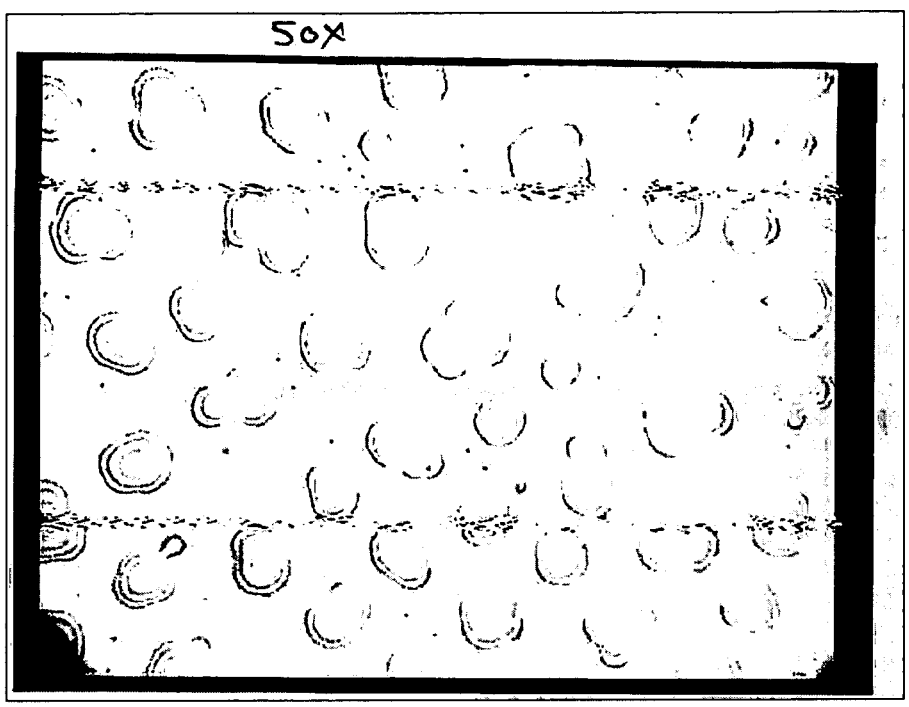
FIG. 8 is a microscope image showing circular growth of the flowable film caused by a completed reaction between the silicon and oxidant precursors.

FIG. 8 shows a microscope image of a film deposited under conditions that allowed the silicon-containing precursor and oxidant reaction to reach completion. As can be seen, the image shows perfect circular growth spots—indicating that the reaction has reached completion.

Figure 9:
FIG. 9 is a microscope image showing irregular growth of the flowable film caused by incomplete reaction between silicon and oxidant precursors due to the presence of an alcohol inhibitor.

A film was deposited with isopropyl alcohol added to steam oxidant. FIG. 9 shows a microscope image of the resulting film. As can be seen in FIG. 9, the microscope image shows irregular grain boundaries, unlike the circular growth depicted in FIG. 8. Without being bound by a particular theory, it is believed that the ethoxy group remains attached to silicon and aids in networking the film by acting as a link. This indicates that the addition of an alcohol inhibitor to the oxidant precursor aids in reducing the reaction rate. This reduction in reaction rate prevents the reaction from reaching completion, due to incomplete conversion of all ethoxy groups caused by an oxidant deficiency.

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of depositing a dielectric film on a substrate, comprising:
   a) placing the substrate in a reaction chamber;
   b) introducing a process gas comprising a silicon-containing compound and an oxidant into the reaction chamber, wherein said oxidant is selected from ozone, oxygen and water; and
   c) exposing the substrate to the process gas under conditions such that the silicon-containing compound and the oxidant react to form a flowable film on the substrate surface, wherein the process conditions prevent the incorporation of organic groups into the flowable film.

2. The method of claim 1 wherein the process gas further comprises an alcohol.

3. The method of claim 1, wherein the chamber pressure during step (c) is between about 5 to 20 Torr.

4. The method of claim 1, wherein the substrate temperature during step (c) is between about −20 and 100° C.

5. The method of claim 4, wherein the substrate temperature during step (c) is between about 0 and 35° C.

6. The method of claim 1, wherein the silicon-containing compound is an organo-silane or an organo-siloxane.

7. The method of claim 1 wherein the silicon-containing compound is selected from TOMCAT, OMCAT, TEOS and TES.

8. The method of claim 1, wherein the flowable film fills a gap on the substrate.

9. The method of claim 8, wherein the gap has an aspect ratio of between about 3:1 and 6:1.

10. The method of claim 1 wherein steps (a)-(c) take place under non-plasma conditions.

11. The method of claim 1 further comprising:
  d) converting the flowable film into a dielectric material.

12. The method of claim 11 wherein step (d) comprises exposing the film to a plasma.

13. The method of claim 12 wherein step (d) comprises exposing the film to an oxygen-containing plasma.

14. The method of claim 11 wherein step (d) comprises thermally annealing the film.

15. The method of claim 1 wherein the flowable film comprises Si—O, Si—OH and Si—H bonds.

16. A method of filling gaps on a substrate with dielectric material comprising:
  a) placing the substrate in a reaction chamber;
  b) introducing a process gas comprising a silicon-containing compound and an oxidant into the reaction chamber, said oxidant selected from ozone, oxygen, and water;
  c) exposing the substrate to the process gas under conditions such that the silicon-containing compound and the oxidant react to form a flowable film in the gap, wherein the process conditions prevent the incorporation of organic groups into the flowable film; and
  d) converting the flowable film to a dielectric material.

17. The method of claim 16 wherein step (d) comprises exposing the flowable film to an oxygen-containing plasma.

18. A method of filling gaps on a substrate with dielectric material comprising:
  a) placing the substrate in a reaction chamber;
  b) introducing a process gas comprising a silicon-containing compound into the reaction chamber;
  c) exposing the substrate to the process gas under conditions such that a silicon-containing film is deposited in the gaps via a plasma-assisted reaction;
  d) introducing an oxidant into the reaction chamber;
  e) exposing the silicon-containing film to the oxidant under conditions such that a flowable film comprising Si—H, Si—O and Si—OH bonds is formed in the gaps, wherein the process conditions prevent the incorporation of organic groups into the flowable film; and
  f) converting the flowable film to a dielectric material.

19. The method of claim 18 wherein step (f) comprises exposing the flowable film to an oxygen-containing plasma.

20. A method of depositing a dielectric film on a substrate, comprising:
  a) placing the substrate in a reaction chamber;
  b) introducing a process gas comprising a silicon-containing compound, an oxidant, and an alcohol into the reaction chamber; and
  c) exposing the substrate to the process gas under conditions such that the silicon-containing compound and the oxidant react to form a flowable film on the substrate surface, wherein the process conditions prevent the incorporation of organic groups into the flowable film.

* * * * *